United States Patent
Hong

(10) Patent No.: US 8,440,576 B2
(45) Date of Patent: May 14, 2013

(54) METHOD FOR PITCH REDUCTION IN INTEGRATED CIRCUIT FABRICATION

(75) Inventor: Shih-Ping Hong, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 907 days.

(21) Appl. No.: 12/109,982

(22) Filed: Apr. 25, 2008

(65) Prior Publication Data
US 2009/0269927 A1    Oct. 29, 2009

(51) Int. Cl.
*H01L 21/337*    (2006.01)

(52) U.S. Cl.
USPC ........... 438/738; 438/692; 438/694; 438/735; 430/311; 430/314; 430/316; 430/317

(58) Field of Classification Search .......... 438/692, 438/694, 735, 738; 430/311, 314, 316, 317; 257/E21.23, E21.243
See application file for complete search history.

(56) References Cited

U.S. PATENT DOCUMENTS

| | | | |
|---|---|---|---|
| 5,328,810 A | 7/1994 | Lowrey et al. | |
| 6,165,692 A * | 12/2000 | Kanai et al. | 430/311 |
| 6,287,918 B1 * | 9/2001 | Xiang et al. | 438/265 |
| 6,548,385 B1 * | 4/2003 | Lai | 438/552 |
| 6,605,541 B1 | 8/2003 | Yu | |
| 6,734,107 B2 | 5/2004 | Lai et al. | |
| 7,183,205 B2 | 2/2007 | Hong | |
| 2003/0203319 A1 * | 10/2003 | Lee | 430/314 |
| 2005/0067659 A1 * | 3/2005 | Gutsche et al. | 257/390 |
| 2005/0227003 A1 * | 10/2005 | Carlson et al. | 427/248.1 |

FOREIGN PATENT DOCUMENTS

| | | |
|---|---|---|
| TW | 230821 | 9/1994 |
| TW | 230840 | 9/1994 |
| TW | 533594 | 5/2003 |
| TW | I220278 | 8/2004 |
| TW | I254416 | 5/2006 |
| TW | I265595 | 11/2006 |
| TW | I274397 | 2/2007 |

* cited by examiner

*Primary Examiner* — Lan Vinh
*Assistant Examiner* — David Kaufman
(74) *Attorney, Agent, or Firm* — Kilpatrick Townsend & Stockton LLP

(57) ABSTRACT

A method for patterning a material is provided. The method includes patterning a second material over a first material over a substrate. A surface portion of the patterned second material is converted to form a third material and a remaining patterned second material, wherein the third material is around the remaining patterned second material. One of the remaining patterned second material and the third material is removed to form a mask. The first material is patterned by using the mask.

3 Claims, 9 Drawing Sheets

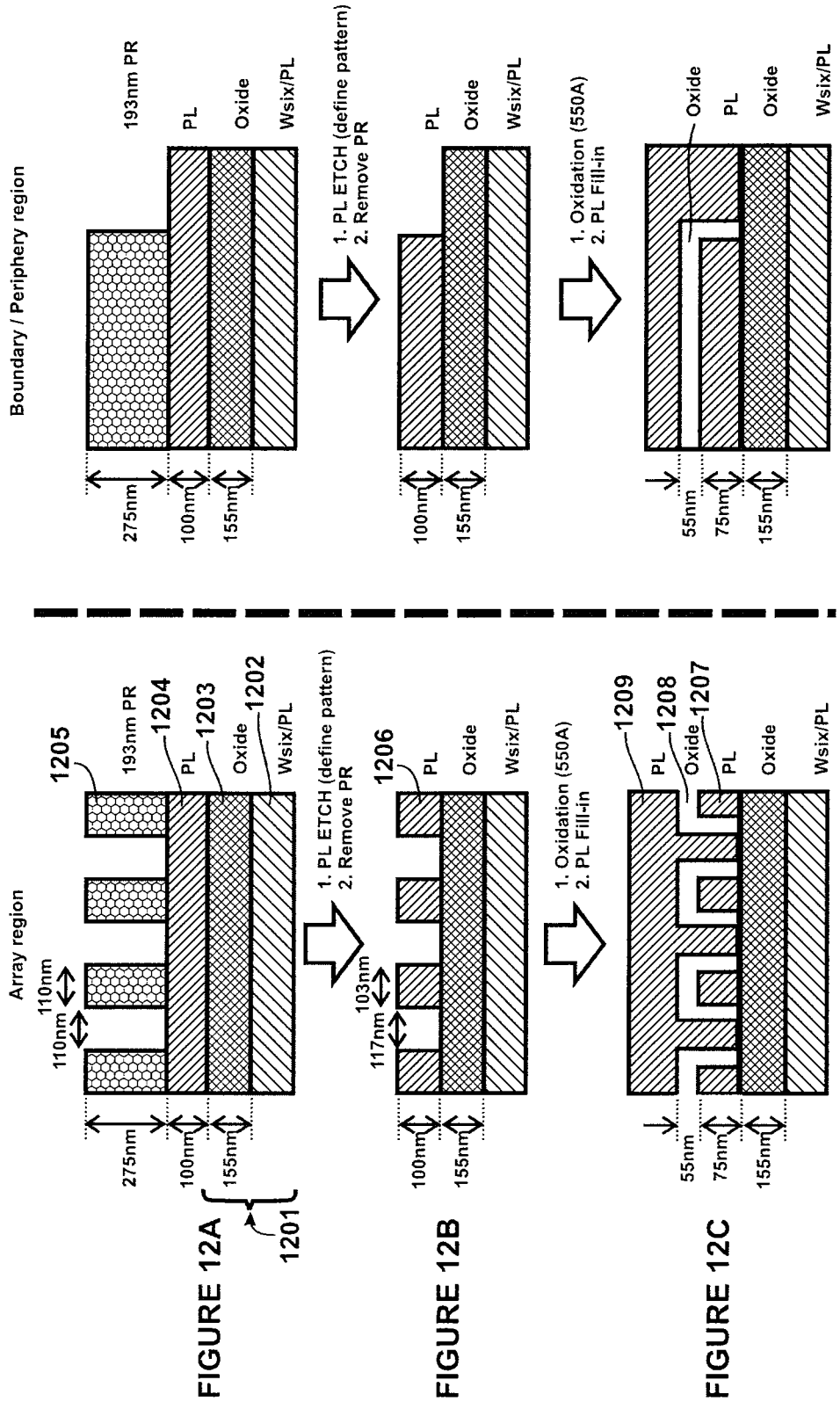

METHOD FOR PITCH REDUCTION IN INTEGRATED CIRCUIT FABRICATION

BACKGROUND OF THE INVENTION

The present invention is directed to integrated circuits and their processing for the manufacture of semiconductor devices. More particularly, the invention provides a method for device pitch reduction for integrated circuits. Merely by way of example, the invention has been applied to integrated circuits including array and periphery regions. But it would be recognized that the invention has a much broader range of applicability. For example, the invention can be applied to forming patterns having width and spacing smaller than the minimum feature size.

Integrated circuits have evolved from a handful of interconnected devices fabricated on a single chip of silicon to millions of devices. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a tenth of a micron across.

Making devices smaller is very challenging, as each process and equipment used in IC fabrication has a limit. Conventional processes usually are limited by a minimum features size that can be manufactured reproducibly. For example, device pitch of an integrated circuit, which is often used to measure the dimension of repeated lines and spaces, is often limited by the lithographic equipment and processes. As the half-pitch becomes less than 65 nm, especially less than 45 nm, lithographic processes often become difficult.

Accordingly, there is a need for improved pattern forming techniques that are not limited by the minimum feature size of conventional processing equipment and processes.

BRIEF SUMMARY OF THE INVENTION

The present invention is directed to integrated circuits and their processing for the manufacture of semiconductor devices. More particularly, the invention provides a method for device pitch reduction for integrated circuits. Merely by way of example, the invention has been applied to integrated circuits including array and periphery regions. But it would be recognized that the invention has a much broader range of applicability. For example, the invention can be applied to forming patterns having width and spacing smaller than the minimum feature size.

In a embodiment, the invention provides a method for patterning a material. The method includes patterning a second material over a first material over a substrate. A surface portion of the patterned second material is converted to form a third material and a remaining patterned second material, wherein the third material is around the remaining patterned second material. One of the remaining patterned second material and the third material is removed to form a mask. The first material is patterned by using the mask.

In embodiments, removing one of the second material or the third material includes selectively etching the third material or the second material. In another embodiment, the method further includes removing a portion of the third material to expose a top surface of the remaining patterned second material. In other embodiment, removing the portion of the third material includes a chemical mechanical polishing (CMP) process. In yet another embodiment, removing the portion of the third material includes using an etching process. In one embodiment, converting the surface portion of the patterned second material to form the third material includes oxidizing the surface portion of the patterned second material. In another embodiment, the second material includes a silicon-containing material. In the other embodiment, the converting process includes at least one of an oxidation process, an nitridation process, and a silicidation process. In yet another embodiment, the third material includes at least one of silicon nitride, silicon oxide, and metallic silicide. In one embodiment, the mask includes at least one of silicon, silicon oxide, silicon nitride, and metallic silicide. In another embodiment, the method further includes forming a fourth material within at least one gap of the patterned second material. In another embodiment, the second material and the fourth material are a substantially same material.

Another embodiment of the present invention provides a method for patterning a material. The method includes patterning a first material overlying a substrate. A portion of the first material is converted into a plurality of features of second material. A third material is filled within gaps between adjacent features of second material. At least one of the first material, the second material, and the third material is removed to form a plurality of features and a plurality of spaces.

Many benefits are achieved by way of the present invention over conventional techniques. For example, the present technique provides an easy to use process that relies upon conventional technology. In a specific embodiment, the pitch of the repetitive pattern can be reduced using methods provided by the invention. But the method is not restricted to such patterns. In other embodiments, the methods provided by the present invention can be used to form features having width and space smaller than the minimum feature size. Additionally, the methods can be applied repeatedly to form even smaller feature size, spacing, or pitch. Since a critical dimension is determined by a chemical reaction in methods provided by the invention, the methods are not restricted to the minimum feature size of the lithography process. Additionally, the method provides a process that is compatible with conventional process technology without substantial modifications to conventional equipment and processes. Depending upon the embodiment, one or more of these benefits may be achieved. These and other benefits will be described in more detail throughout the present specification and more particularly below.

Various additional objects, features, and advantages of the present invention can be more fully appreciated with reference to the detailed description and accompanying drawings that follow.

BRIEF DESCRIPTION OF THE DRAWINGS

FIGS. 12A-12G are simplified cross-sectional diagrams of a method for fabricating an integrated circuit according to an embodiment of the present invention.

DETAILED DESCRIPTION OF THE INVENTION

The present invention is directed to integrated circuits and their processing for the manufacture of semiconductor devices. More particularly, the invention provides a method for device pitch reduction for the integrated circuits. Merely by way of example, the invention has been applied to integrated circuits including array and periphery regions. But it would be recognized that the invention has a much broader range of applicability. For example, the invention can be applied to forming patterns having width and spacing smaller than the minimum feature size.

As discussed above, minimum feature size often limit the device pitch which can be manufactured using conventional equipment and processes. Various techniques have been proposed to make features smaller than the minimum feature size. These techniques often include forming spacers and are usually complex. Another drawback of these techniques is that they usually cannot reduce line feature width and spacing simultaneously. Accordingly, there is a need for improved pattern forming techniques.

Depending upon the embodiment, the present invention includes various features, which may be used. These features include the following:

1. techniques for lines and spaces below lithography minimum feature size;
2. simultaneous line and space dimension reduction;
3. reproducible method using simple, conventional process equipment and processes; and
4. methods for a variety of line and space dimensions smaller than minimum features.

As shown, the above features may be in one or more of the embodiments to follow. These features are merely examples, which should not unduly limit the scope of the claims herein. One of ordinary skill in the art would recognize many variations, modifications, and alternatives.

Figure 1:
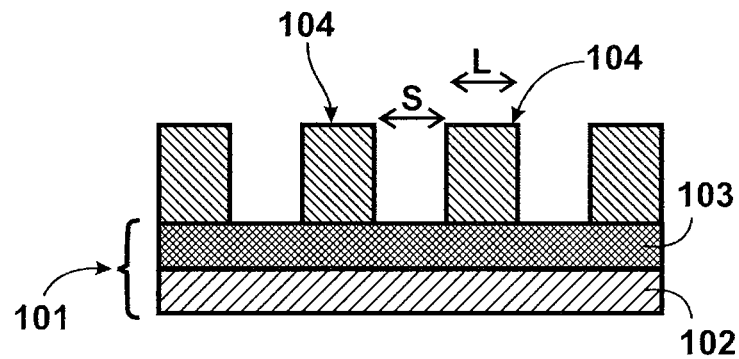
FIGS. 1-4 are simplified cross-sectional view diagrams of a method for forming small features in an integrated circuit according to an embodiment of the present invention.

FIGS. 1-4 are simplified cross-sectional view diagrams of a method for forming small patterned features in an integrated circuit according to an embodiment of the present invention. These diagrams are merely examples, which should not unduly limit the scope of the claims herein. One of ordinary skill in the art would recognize other variations, modifications, and alternatives. The method is applicable in a variety of applications. In a specific embodiment, the small patterned features are made in part of an integrated circuit fabrication process. As shown in FIG. 1, the method provides a substrate 101, which may include a semiconductor substrate, such as a silicon substrate. Alternatively, substrate 101 may include device structures fabricated using conventional integrated circuit processing techniques. In the particular example shown in FIG. 1, substrate 101 includes a layer of insulating material 103, such as oxide or nitride, overlying an under layer 102. In an embodiment, under layer 102 may include conventional integrated circuit device structures. Next, a first layer of polysilicon is formed overlying substrate 101 and is patterned to form polysilicon features such as 104 using conventional patterning techniques. Such conventional patterning techniques may include photolithography and etching processes. In an embodiment, each polysilicon feature 104 includes sidewalls and a top surface as shown in FIG. 1. As an example, polysilicon feature 104 has a width L and is separated from an adjacent polysilicon feature by spacing S. In a specific embodiment, the polysilicon features may be repetitive patterns including line width L and spacing S in the pattern. In other embodiments, the size and spacing associated with the polysilicon features may vary.

Figure 2:
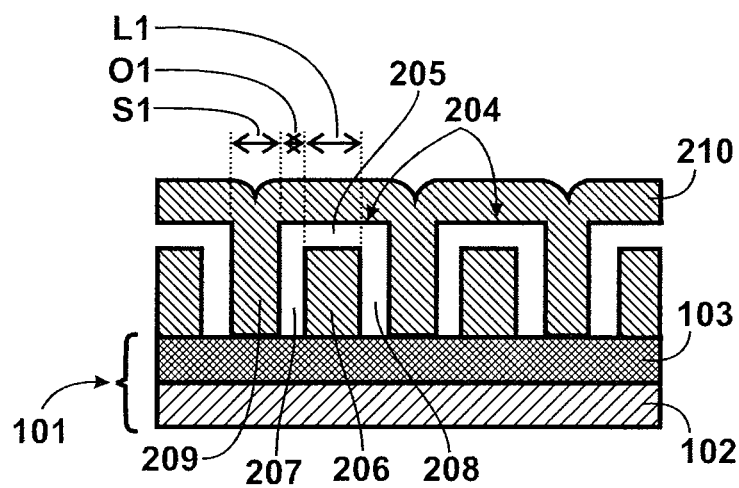

In FIG. 2, a chemical reaction process is performed to convert the polysilicon features to form oxidized polysilicon features, such as 204. In an embodiment, the chemical reaction process includes a thermal oxidation of polysilicon, which forms an oxide 205. Each of the oxidized polysilicon features includes a first region of polysilicon 206 of width L1 sandwiched between two regions 207 and 208 of oxide. As shown, each of the two regions of oxide 207 and 208 is characterized by thickness O1. In the oxidation process a first thickness of polysilicon at the sidewalls of each of the polysilicon features 104 is converted to form an oxide of thickness O1. As shown in FIG. 2, a separation between the oxidized polysilicon feature 204 and an adjacent oxidized polysilicon feature is designated as S1.

Next, the method includes forming a second layer of polysilicon 210 overlying the oxidized polysilicon features and the substrate. The second layer of polysilicon fill gaps between adjacent oxidized polysilicon features. As shown in FIG. 2, a specific gap 209 has a spacing S1. Depending on the chemical reaction, certain relationships among the various dimensions can be established, as discussed below.

Figure 3:
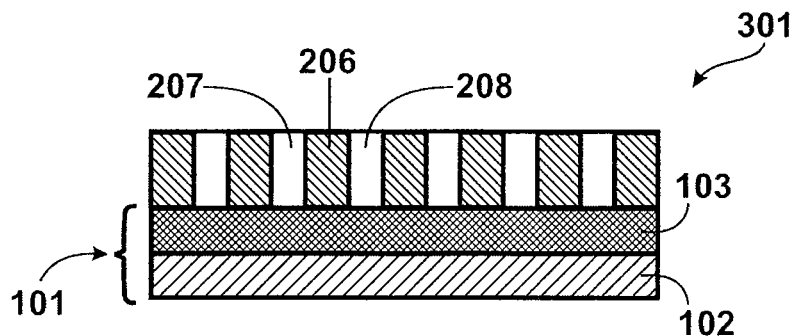

In FIG. 3, the method includes forming a substantially planar structure 301 by selectively removing portions of the second layer of polysilicon and portions of the oxidized polysilicon features. In an embodiment, a chemical mechanical polishing process is used to form the substantially planar structure. In another embodiment, an etchback process can be used. Referring to FIG. 2, portions of the second layer of polysilicon 210 and portions of the oxidized polysilicon feature 204 are removed. Top surfaces of polysilicon region 206, oxide region 207, and oxide region 208 are exposed to form a substantially planar structure. As shown in FIG. 3, the substantially planar structure includes alternate features of polysilicon (e.g. 206) and oxide (e.g. 207). Depending on the embodiment, a pattern of polysilicon features or a pattern of oxide features can be formed, as discussed below.

Figure 4:
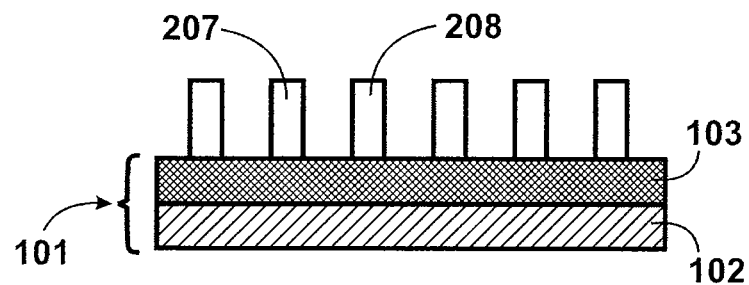

In FIG. 4, according to a specific embodiment, the method includes removing the polysilicon from the substantially planar structure 301 to form a pattern of oxide features (e.g. 207). Here, conventional etching processes can be used. For example, it may be advantageous to use an etching process exhibiting favorable etch selectivity of polysilicon over oxide. It is seen that the number of oxide features is higher in the number of the original polysilicon features (e.g. 104 in FIG. 1). Additionally the width of the oxide features can be made smaller than the width of the original polysilicon features (e.g. 104) as discussed below.

Figure 5:
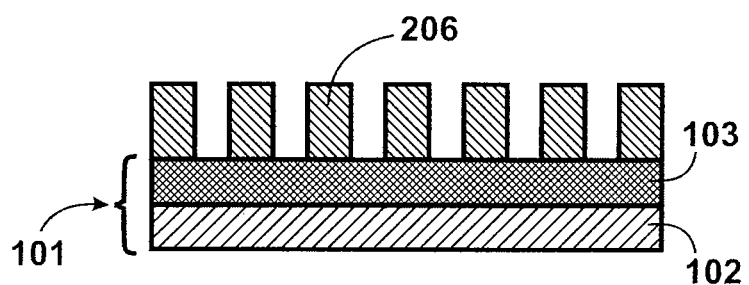
FIG. 5 is a simplified cross-sectional diagram of an alternative process in the method described in FIGS. 1-4 according to an embodiment of the present invention.
Figure 6:
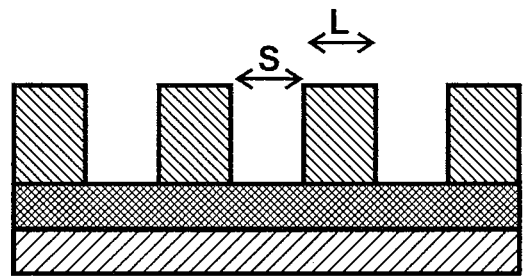
FIGS. 6-10 are simplified cross-sectional view diagrams of another method for forming small features in an integrated circuit according to an embodiment of the present invention.
Figure 7:
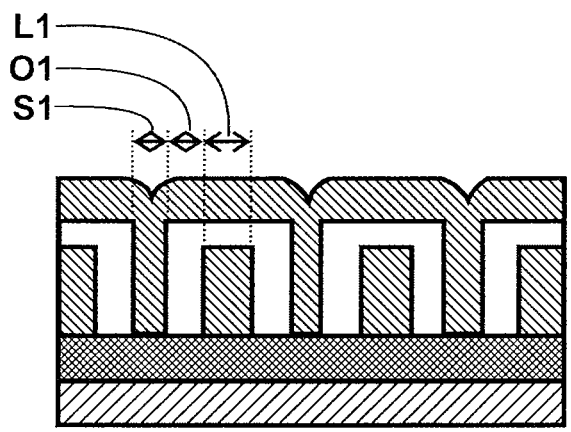
Figure 8:
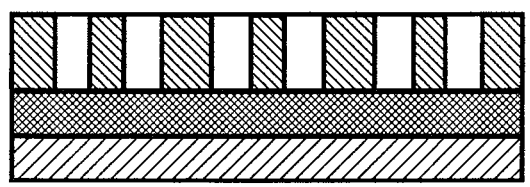
Figure 9:
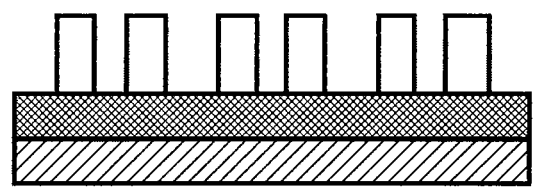
Figure 10:
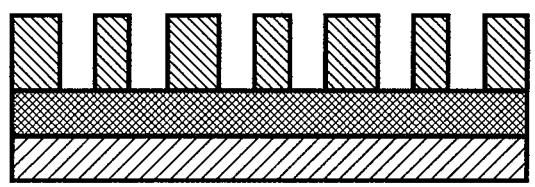

FIG. 5 is a simplified side-view diagram of an alternative process in the method described in FIGS. 1-4 according to an embodiment of the present invention. As shown, the method includes removing the oxide from the substantially planar structure 301 in FIG. 3 to form a pattern of polysilicon features (e.g. 206 in FIG. 5). Here, conventional etching processes can be used. It is seen that the number of polysilicon features is higher in the number of the original polysilicon features (e.g. 104 in FIG. 1). As discussed below, the width of the polysilicon features (e.g. 206) can be made smaller than the width of the original polysilicon features (e.g. 104).

In thermal oxidation of silicon, a certain volume of silicon is converted to a second volume of oxide. The volume ratio of the consumed silicon to the resultant oxide is about 0.44.

Referring back to FIG. 2, with a Volume Conversion Ratio designated as VCR, the following relationships can be established.

$$L1 = L - 2*(O1*VCR) \quad (1)$$

$$S1 = S - 2*(O1*(1-VCR)) \quad (2)$$

$$L + S = L1 + S1 + 2*O1 \quad (3)$$

In the above, the original dimension of feature=L, the original dimension of space=S, L1 designates the width of the feature material after the reaction, O1 designates the thickness of the new material formed, and S1 is the spacing between the converted features. According to embodiments of the invention, these parameters can be used to form patterns that include various combinations of feature size and spacing. As a specific example, in FIG. 4, the pitch of the pattern is substantially half of the pitch of the pattern in FIG. 1. Further, the line width in FIG. 4, which is equal to O1 in FIG. 2, is smaller than the line width L in FIG. 1. The spacing in FIG. 4, which is L1 in FIG. 2, is smaller than the spacing S in FIG. 1. Similarly the pitch, line width, and spacing in FIG. 5 are smaller than the pitch, line width, and spacing in FIG. 1, respectively. Of course, there can be other variations and alternatives, as discussed below.

FIGS. 6-10 are simplified cross-sectional view diagrams of another method for forming small features in an integrated circuit process according to an embodiment of the present invention. The method includes processes similar to those in the method discussed above. By adjusting the oxidation process, a different thickness of oxide O1 is formed on the sidewalls of the resultant polysilicon. Accordingly, various combinations are obtained in the thicknesses and spacings in the oxide patterns in FIG. 9 or the thicknesses and spacings in the polysilicon patterns in FIG. 10.

Figures 11A, 11B, 11C:
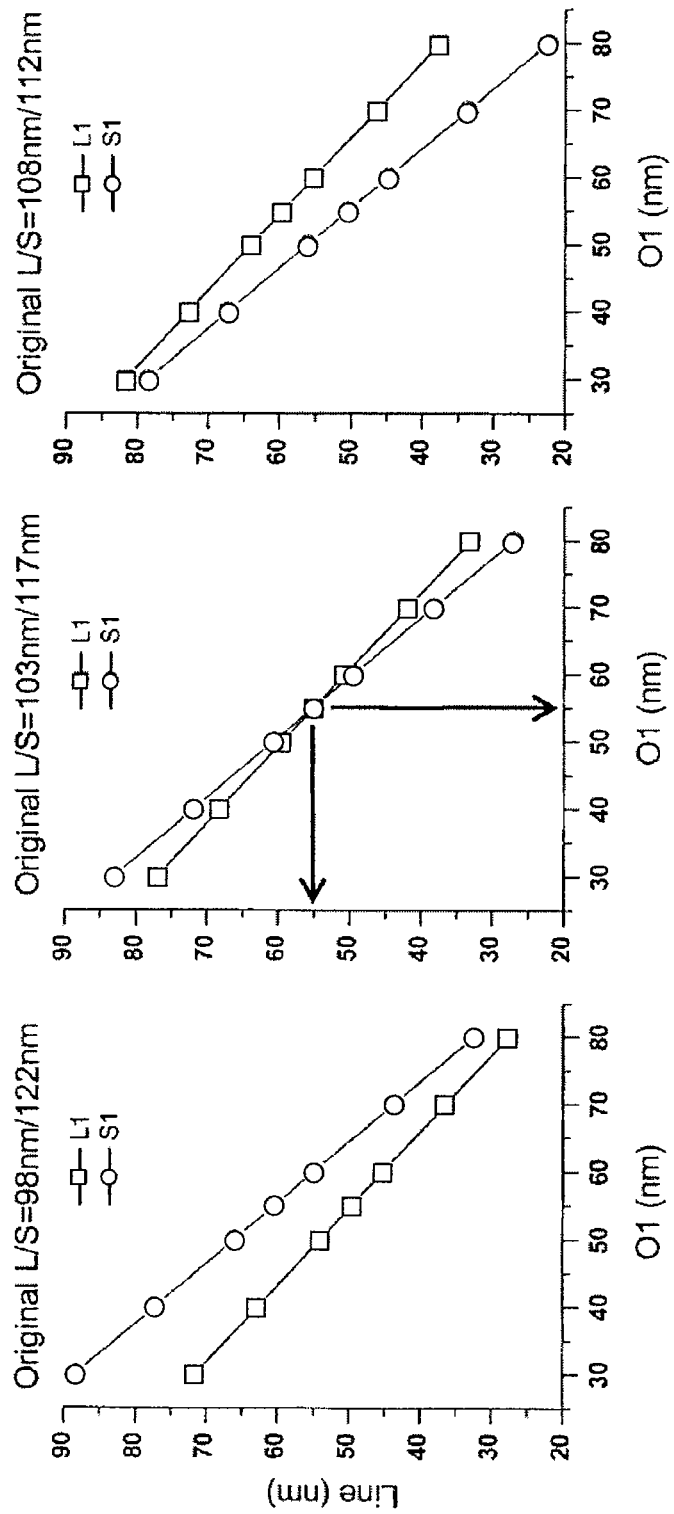
FIGS. 11A-11C are simplified diagrams illustrating feature dimensions that can be obtained in the methods of FIGS. 1-4 and 6-9 according to an embodiments of the present invention.

FIGS. 11A-11C are simplified diagrams illustrating feature dimensions that can be obtained in the methods of FIGS. 1-10 according to an embodiments of the present invention. FIGS. 11A-11C are examples showing the resultant width L1 and spacing S1 which can be obtained by varying the initial width L, initial spacing S, and oxide thickness O1. For example, in FIG. 11A, L =98 nm, and S=122 nm. L1 and S1 are listed as a function of O1 in Table 1 below, wherein the units are in nm.

TABLE 1

| O1 | L1 | S1 |
|---|---|---|
| 30 | 71.6 | 88.4 |
| 40 | 62.8 | 77.2 |
| 50 | 54 | 66 |
| 55 | 49.6 | 60.4 |
| 60 | 45.2 | 54.8 |
| 70 | 36.4 | 43.6 |
| 80 | 27.6 | 32.4 |

In FIG. 11B, L=103 nm, and S=117 nm. LI and S1 are listed as a function of O1 in Table 2 below (with units in nm).

TABLE 2

| O1 | L1 | S1 |
|---|---|---|
| 30 | 76.6 | 83.4 |
| 40 | 67.8 | 72.2 |
| 50 | 59 | 61 |
| 55 | 54.6 | 55.4 |
| 60 | 50.2 | 49.8 |

TABLE 2-continued

| O1 | L1 | S1 |
|---|---|---|
| 70 | 41.4 | 38.6 |
| 80 | 32.6 | 27.4 |

In FIG. 11C, L=108 nm, and S=112 nm. L1 and S1 are listed as a function of O1 in Table 3 below (with units in nm).

TABLE 3

| O1 | L1 | S1 |
|---|---|---|
| 30 | 81.6 | 78.4 |
| 40 | 72.88 | 67.2 |
| 50 | 64 | 56 |
| 55 | 59.6 | 50.4 |
| 60 | 55.2 | 44.8 |
| 70 | 46.4 | 33.6 |
| 80 | 37.6 | 22.4 |

As discussed above, various combinations of feature width and spacing can be obtained by selecting original widths and spacings, as well as the oxide thickness. For example, final dimensions L1, O1, and S1 may satisfy one of the following conditions.

1. L1=O1=S1
2. L1=O1≠S1
3. L116 O1=S1
4. L1=S1≠O1
5. L1≠O1≠S1h

According to embodiments of the invention, the volume conversion ratio (VCR) can also be varied by selecting a different chemical reaction process. In an embodiment, the chemical reaction could be an oxidation process or any other process which consumes Si to form a second material and shrink the spacing. For example, a silicon nitridation process can be used to form silicon nitride. In another example, a silicon oxynitride process can be used to form SiON. In certain embodiments, the initial features in FIG. 1 can be formed in polysilicon, single crystalline silicon, undoped silicon, or doped silicon. In other embodiments, the initial features in FIG. 1 can be formed in a metal layer and the chemical reaction can be a metal silicidation process. In various embodiments, the metal can include platinum, nickel, cobalt, titanium, tantalum, platinum, or molybdenum, etc. Conventional silicidation process can then be used with the selected metal to form metal silicide.

A method for forming a pattern on a substrate according to an embodiment of the present invention can be briefly outlined below.

1. providing a substrate;
2. forming a first layer of a first material overlying the substrate;
3. patterning the first layer of first material to form a first plurality of first material features, each of the first plurality of first material features having sidewalls and a top surface;
4. performing a chemical reaction process to convert the first plurality of first material features to form a corresponding plurality of converted features, a first thickness of first material at the sidewalls of each of the first plurality of first material features being converted to form a second thickness of a second material, each of the converted features including a region of first material sandwiched between two regions of second material, each of the two regions of second material characterized by the second thickness;

5. forming a second layer of first material overlying the converted features and the substrate, the second layer of first material filling gaps between adjacent converted features; and
6. forming a substantially planar structure by selectively removing portions of the second layer of first material and portions of the converted features, the substantially planar structure including a second plurality of first material regions, the second plurality being higher in number than the first plurality, the substantially planar structure further including a third plurality of second material regions, the third plurality being higher in number than the first plurality.

The method then includes options to form patterns using the second plurality of first material regions or the third plurality of second material regions. In a specific embodiment, the method includes removing either second material from the substantially planar structure to form a second plurality of first material features. In another embodiment, the method includes removing first material from the substantially planar structure to form a third plurality of second material features.

The above sequence of processes provides a method for forming a pattern according to an embodiment of the present invention. As shown, the method uses a combination of processes including a way performing a chemical reaction and a combination of filling and planarization processes to form features having reduced width and spacing of patterns. Some of embodiments are discussed above with reference to FIGS. 1-13. Other alternatives can also be provided where processes are added, one or more steps are removed, or one or more processes are provided in a different sequence without departing from the scope of the claims herein. Further details of the present method can be found throughout the present specification.

FIGS. 12A-12G are simplified cross-sectional view diagrams of a method for fabricating an integrated circuit using the pattern-forming method outlined above according to an embodiment of the present invention. These diagrams are merely examples, which should not unduly limit the scope of the claims herein. One of ordinary skill in the art would recognize other variations, modifications, and alternatives. In the specific embodiment, the method for forming patterns is applied to a process for making an integrated circuit which includes an array region and a periphery region. As shown, the left cross-sectional view in each of FIGS. 12A-12G is through the array region and in the right cross section view, in the periphery region. The cross-sectional views are not necessarily to scale, and in particular, the physical dimensions of the same layers or regions in the right and the left cross section views may not appear the same.

In FIG. 12A, the method for forming a pattern on a substrate includes providing a substrate 1201. In a specific embodiment, the substrate includes an oxide layer 1203 overlying an under layer 1202. In an example, the under layer is a WSix or Polysilicon (PL) layer, but can include any other suitable material or device structures for integrated circuit applications. The method includes forming a first layer of a first material overlying the substrate. As shown, 100 nm of polysilicon layer 1204 is formed on the substrate in FIG. 12A. Next, photo resist layer 1205 is formed and patterned, and in FIG. 12B used to pattern the PL layer 1204 to form a first plurality of polysilicon features 1206. Each of the polysilicon features 1206 has sidewalls and a top surface.

Figures 12D, 12E, 12F:
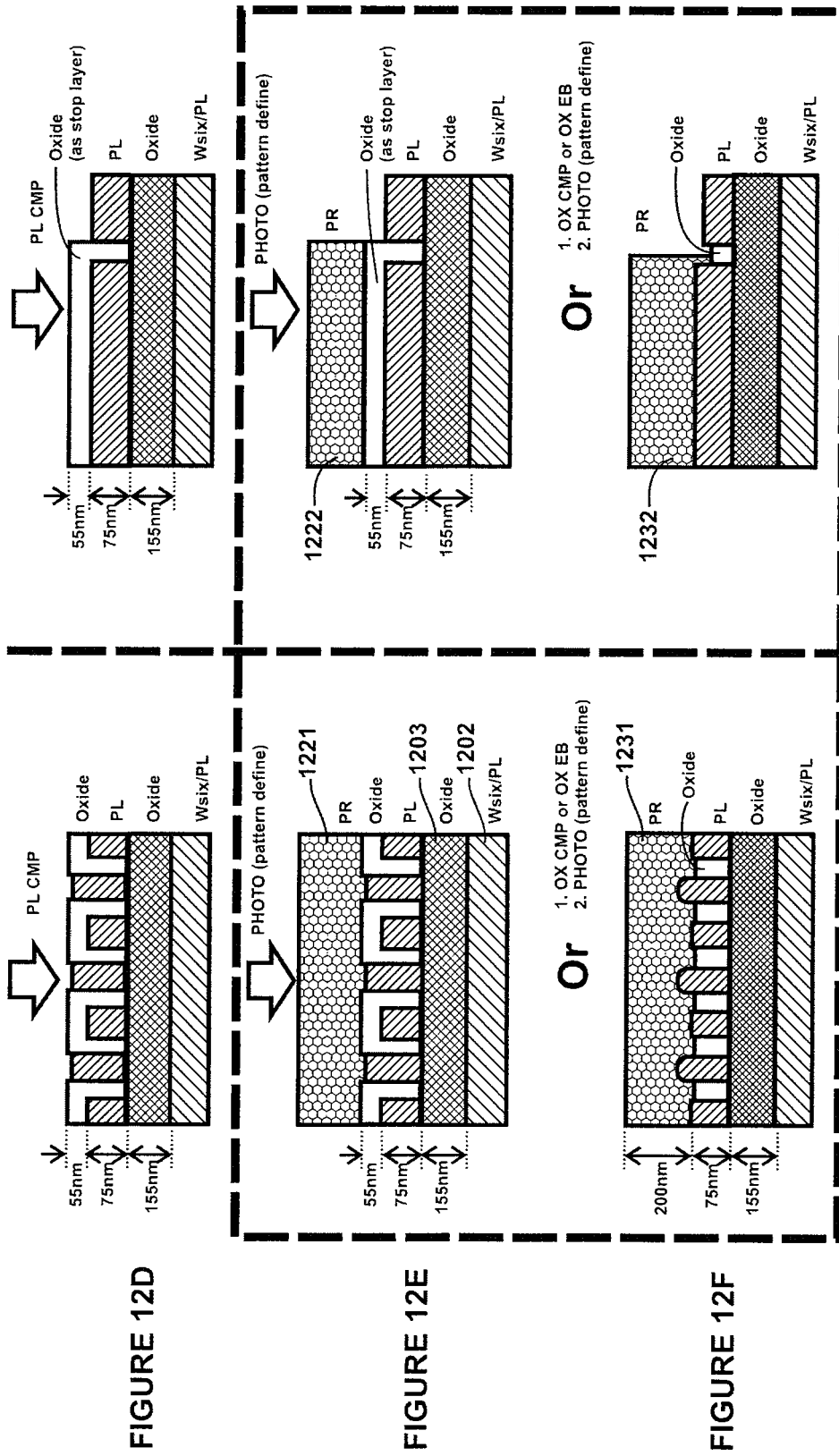
Figure 12G:
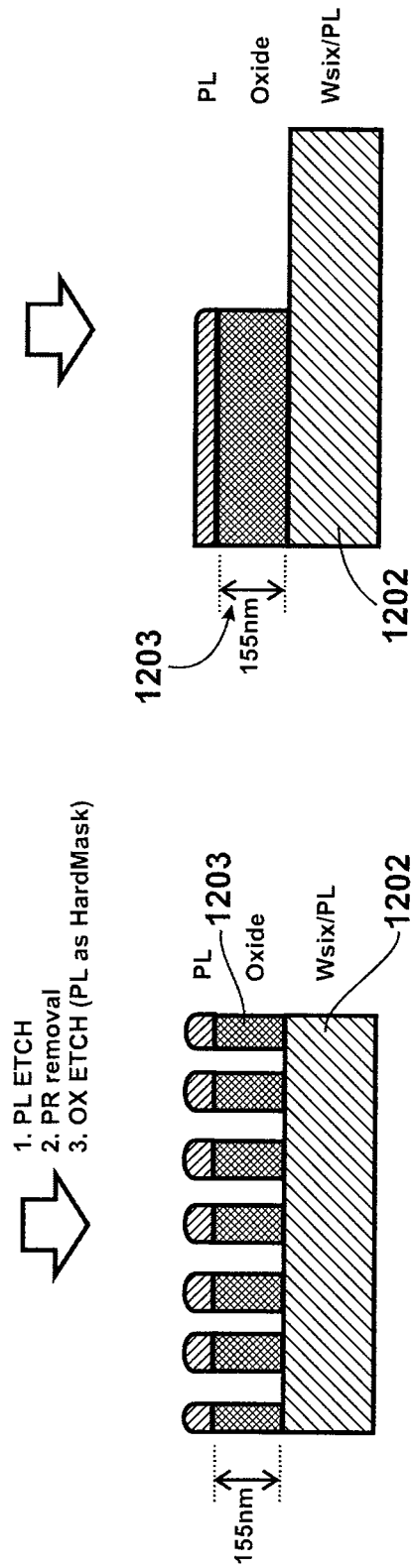

In FIG. 12C, an oxidation process is performed to convert the polysilicon features to form oxidized polysilicon features. Each of the oxidized polysilicon feature includes an oxide layer 1208 overlying the remaining polysilicon feature 1207. Then a second layer of polysilicon 1209 is formed overlying the oxidized polysilicon features and the substrate and filling gaps between adjacent converted features. In FIG. 12D, the method includes forming a substantially planar structure using a chemical mechanical polishing process (CMP) to expose the top portion of the polysilicon layer and expose a top surface of the oxide layer. Next, in FIG. 12E, the array region on the left is masked by a layer of photoresist 1221, while the photoresist layer is selectively patterned, 1222, in the periphery region on the right. In FIG. 12G, a polysilicon etch is performed to remove the exposed polysilicon in the periphery region. Then the photoresist is removal, and an oxide etch is performed. Here the exposed polysilicon features are used as a hard mask for etching the oxide layer 1203 in the substrate, as shown in FIG. 12G.

In an alternative embodiment, following the process in FIG. 12D, the process in FIG. 12 F is performed. Here an oxide CMP or oxide etchback process is performed to expose the polysilicon top surface. Then the array region on the left is masked by a layer of photoresist 1231, while the photoresist layer is selectively patterned (1232) in the periphery region on the right. The processes associated with FIG. 12G are then performed to use the polysilicon features as a hard mask for etching the oxide layer in the substrate.

Figure 13:
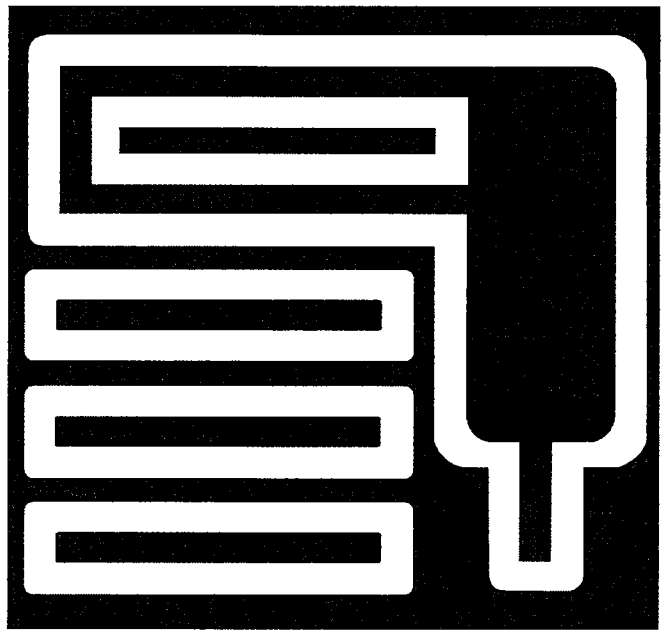
FIG. 13 is a simplified top-view diagram illustrating a pattern formed using a method according to an embodiment of the present invention.
Figure 13:
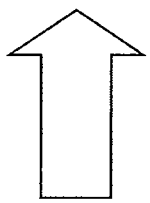
Figure 13:

It is noted that in FIGS. 12A-12G, the method for forming patterns is applied to an integrated circuit process in which the array region may include repetitive patterns. In a specific embodiment, the pitch of the repetitive pattern can be reduced using methods provided by the invention. But the method is not restricted to such patterns. For example, FIG. 13 is a simplified top-view diagram illustrating a pattern forming method according to an embodiment of the present invention. In a specific embodiment, the original feature on the left may include the minimum feature size available in a conventional patterning process. On the right, multiple features are formed which include widths and spaces smaller than those in the original pattern on the left. As seen, the methods provided by the present invention can be used to form features having width and space smaller than the minimum feature size. Additionally, the methods can be applied to repeatedly to form even smaller feature size, spacing, and pitch. Since a critical dimension is determined by a chemical reaction, the methods are not restricted to the minimum feature size of the conventional process.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A method for patterning a material comprising:
   patterning a second material over a first material over a substrate;
   converting a surface portion of the patterned second material to form a third material and a remaining patterned second material, wherein the third material is around the remaining patterned second material;
   filling gaps between structures of the third material with a fourth material;
   removing a top portion of the fourth material to expose a top surface of the third material;
   removing a top portion of the third material to expose a top surface of the remaining patterned second material, wherein the top surface of the remaining portions of the second material is lower than a top surface of the remaining fourth material.

2. The method of claim 1, wherein the second material and the fourth material are polysilicon, and the remaining portions of the polysilicon form a plurality of patterned polysilicon structures disposed in a sequence in which adjacent patterned polysilicon structures are characterized by different heights.

3. The method of claim 1, wherein the remaining portions of the fourth material are taller than the remaining patterned second material by a thickness of the third material.

* * * * *